(12) United States Patent
Nurser

(10) Patent No.: US 6,604,213 B1
(45) Date of Patent: Aug. 5, 2003

(54) METHOD AND APPARATUS FOR DETERMINING A MINIMUM CLOCK DELAY IN A MEMORY

(75) Inventor: Henry Nurser, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/546,810

(22) Filed: Apr. 11, 2000

(30) Foreign Application Priority Data

Jun. 16, 1999 (GB) .............................. 9914069

(51) Int. Cl.$^7$ .......................... G11C 29/00; G01R 31/30
(52) U.S. Cl. ...................................... 714/718; 714/745
(58) Field of Search ............................... 714/718, 721, 714/734, 745

(56) References Cited

U.S. PATENT DOCUMENTS

| 5,576,996 A | 11/1996 | Awaya et al. ......... 365/189.01 |
| 5,875,135 A | 2/1999 | Patwardhan et al. ........ 365/194 |
| 6,421,801 B1 * | 7/2002 | Maddux et al. ............. 714/744 |

FOREIGN PATENT DOCUMENTS

| EP | 0 867 887 | 9/1998 | .......... G11C/29/00 |
| EP | 0 898 284 | 2/1999 | .......... G11C/29/00 |
| WO | WO 99/04400 | 1/1999 | .......... G11C/29/00 |

OTHER PUBLICATIONS

European Search Report from corresponding European application No. 00 30 2825.

* cited by examiner

Primary Examiner—Albert Decady
Assistant Examiner—Cynthia Briti
(74) Attorney, Agent, or Firm—Wolf, Greenfield & Sacks, P.C.; James H. Morris; Robert A. Skrivanek, Jr.

(57) ABSTRACT

An apparatus and method for determining a minimum clock delay provided to sense amplifiers of a memory array. The method first determines a response time of the overall memory circuit by varying the delay of an external clock until the output of the memory circuit is just valid. Then an externally provided sense amplifier clock is substituted for the internal sense amplifier clock and the instant of application of the externally provided sense amplifier clock is varied until the circuit output is just valid.

13 Claims, 5 Drawing Sheets

METHOD AND APPARATUS FOR DETERMINING A MINIMUM CLOCK DELAY IN A MEMORY

FIELD OF THE INVENTION

The present invention relates to a method of operating a device such as a memory, a testing device for a memory and to a method of determining a minimum sense amplifier clock delay.

BACKGROUND OF THE INVENTION

Semiconductor memories have a matrix of memory cells, the matrix having rows formed by wordlines and columns formed by complementary pairs of bitlines. The bitline pairs are connected to clocked sense amplifiers which evaluate the contents of a cell which is connected to the bitlines. The complementary bitlines tend to have a high capacitance and the memory cells tend to have a relatively low current driving capability which means that the differential voltage across the complementary pair of bitlines increases relatively slowly.

An ideal sense amplifier would be capable of connection to the bitlines shortly after the memory cell was connected to them and would then respond to the increasing differential voltage to provide either a logic 1 or logic 0 output. However, sense amplifiers normally have an input offset. This offset, which may be positive or negative, must be overcome by the differential voltage on the bitlines before the sense amplifier can latch into the correct state.

For security it is therefore common practice to delay clocking the sense amplifier until a large differential voltage has developed across the complementary bitlines. This allows for manufacturing tolerances. It also avoids the need for measuring the minimum time needed for correct sensing to occur. Such a measurement is difficult especially where the memory is embedded.

The present invention aims to provide a technique for determining the minimum sense amplifier clock delay, which minimum delay still gives rise to a correct output from the sense amplifier.

SUMMARY OF THE INVENTION

According to a first aspect of the present invention there is provided a method of operating a device, the device comprising circuitry having an input responsive to a first timing signal and producing a valid output to clocked output circuitry after a first delay, said clocked output circuitry having a clock node, and a clock delay circuit responsive to said first timing signal for providing at a second delay, a second timing signal to said clock node of said clocked output circuitry, the method comprising repeatedly applying said first timing signal followed by an external timing signal, wherein said external timing signal is applied via a delay-producing first path to said clock node; monitoring an output of said clocked output circuitry; varying the delay of application of said external timing signal with respect to said first timing signal; and in response to a desired output of said clocked output circuitry, modifying said second delay.

Preferably said desired output is a just valid output such that any reduced delay in said external timing signal gives rise to an invalid output.

Advantageously before said repeatedly applying step said method further comprises determining when said second timing signal occurs and, during said repeatedly applying step, determining when said desired output occurs.

Conveniently said step of determining when said second timing signal occurs comprises providing latch circuitry responsive to the output of said clocked output circuitry, said latch circuitry having a latch clock node connected to a latch clock pad via a delay producing second path; successively providing said second timing signal to said clock node of said clocked output circuitry and a latch timing signal to said latch clock pad; varying the time of occurrence of said latch timing signal; and monitoring the latch circuitry output.

Advantageously after said step of monitoring the latch circuitry output, the method further comprises applying the externally generated clock signal via the delay-producing first path to said clock node and varying the time thereof; and monitoring the latch circuitry output.

Conveniently said device is a memory comprising an address register having a clock input, an array of memory cells having wordlines connected to said address register, and plural bitlines and clocked sense amplifiers for evaluating said bitlines.

According to a second aspect of the present invention there is provided a method of determining a minimum sense amplifier clock delay in a memory, the memory comprising address register circuitry having a clock input, an array of memory cells having wordlines coupled to said address register circuitry and bitlines connected to sense amplifier circuitry, said sense amplifier circuitry having a clock input, the memory further having output circuitry having an input coupled to the output of said sense amplifier circuitry and an output, the method comprising:

providing a first path having an input, said first path having an output coupled to said clock input of said address register circuitry;

providing a second path having an input, said second path having an output coupled to said clock input of said sense amplifier circuitry;

repeatedly applying first timing signals at said input of said first path and at a variable delay after each said application, applying a second timing signal at said input of said second path; and evaluating conditions at said output of said output circuitry.

Preferably said output circuitry has an output circuitry clock input, said memory further comprises a sense amplifier clock generator having an output, and said method comprises, before said repeatedly applying step, the repeated steps of applying first timing signals at said first path, and applying the output of said sense amplifier clock pulse generator to said clock input of said sense amplifier circuitry whilst varying the delay of application of a timing signal with respect to said first timing signal to said clock input of said output circuitry until a desired output condition exists.

Advantageously said repeatedly applying step comprises applying said timing signal to said output circuitry clock input at the delay where said desired output condition exists.

Advantageously said desired condition is a condition where an output is valid, but any reduction in said delay gives rise to an invalid output.

According to a third aspect of the present invention there is provided a testing device for a memory, said memory having address register circuitry having an address register clock node, a memory array and sense amplifier circuitry having a sense amplifier clock node and a sense amplifier output, said testing device comprising a first timing signal generator coupled to said address register clock node via a first path for clocking said address register circuitry, a sense amplifier clock generator responsive to a signal at said address register clock node for producing a first sense amplifier clock signal, a second timing signal generator coupled to said sense amplifier clock node for providing a second sense amplifier clock signal, clocking and selector circuitry for selectably coupling said first or said second sense amplifier clock signal, to said sense amplifier clock node, said device further comprising means for varying the relative timing of said first timing signal with respect to said second timing signal.

Advantageously said testing device further comprises output circuitry connected between said sense amplifier output and a device output, and evaluating apparatus coupled to said device output.

Conveniently said output circuitry comprises clocked latch circuitry connected at said sense amplifier output, and having a clock node coupled to receive a third timing signal.

BRIEF DESCRIPTION OF THE DRAWINGS

An embodiment of the invention will now be described, by way of example only, with reference to the accompanying drawings in which.

DESCRIPTION OF THE PREFERRED EMBODIMENTS

Figure 1:
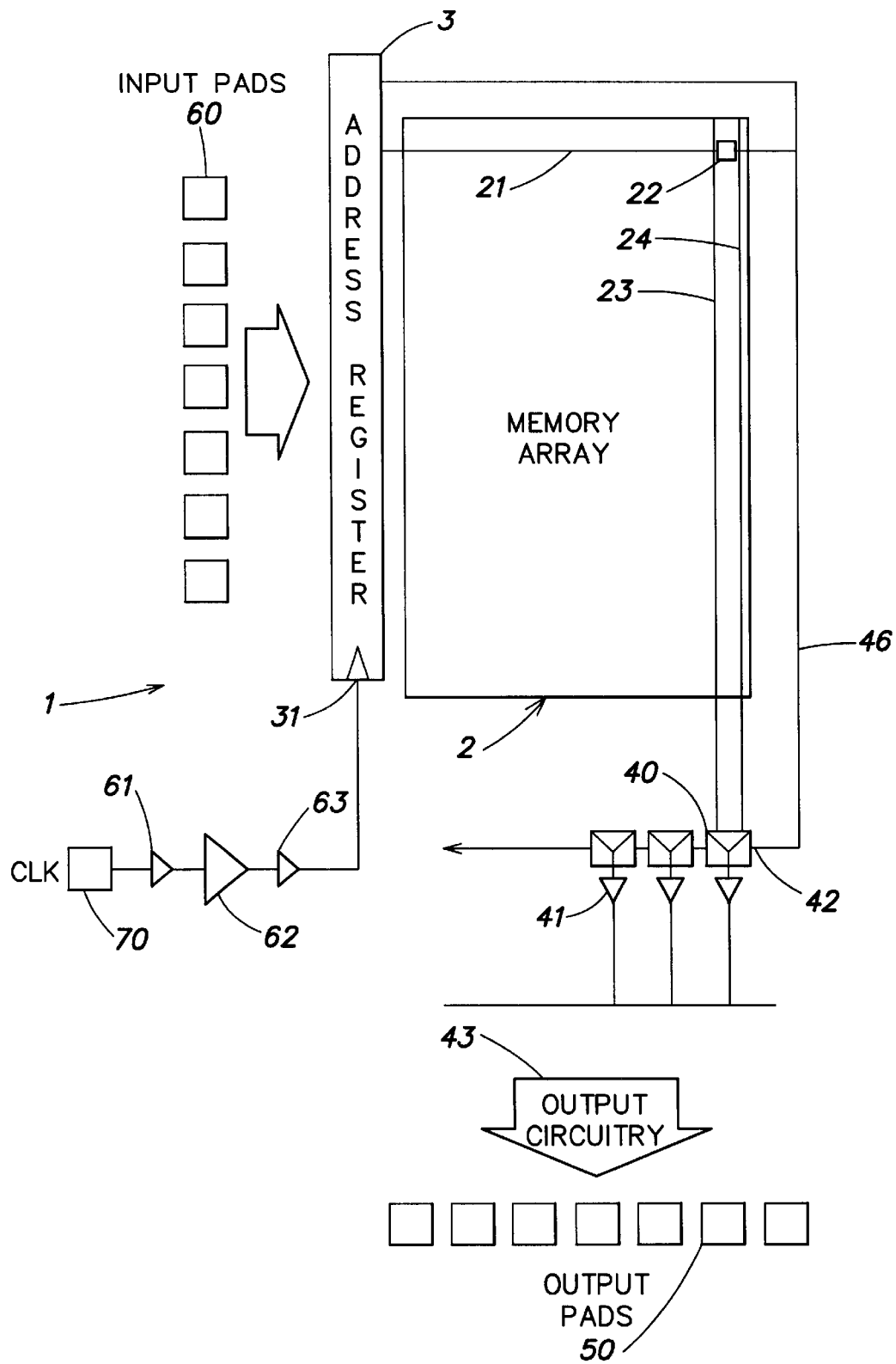
FIG. 1 shows a block schematic view of a memory circuit of the prior art.

In the various figures, like reference numerals refer to like parts.

Referring first to FIG. 1 a SRAM test chip 1 consists of a matrix memory array 2 which has an address register 3 connected to its plural wordlines 21, of which only one is shown. The wordlines 21 connect to a regular array of memory cells 22, of which again only one is shown.

Figure 2:
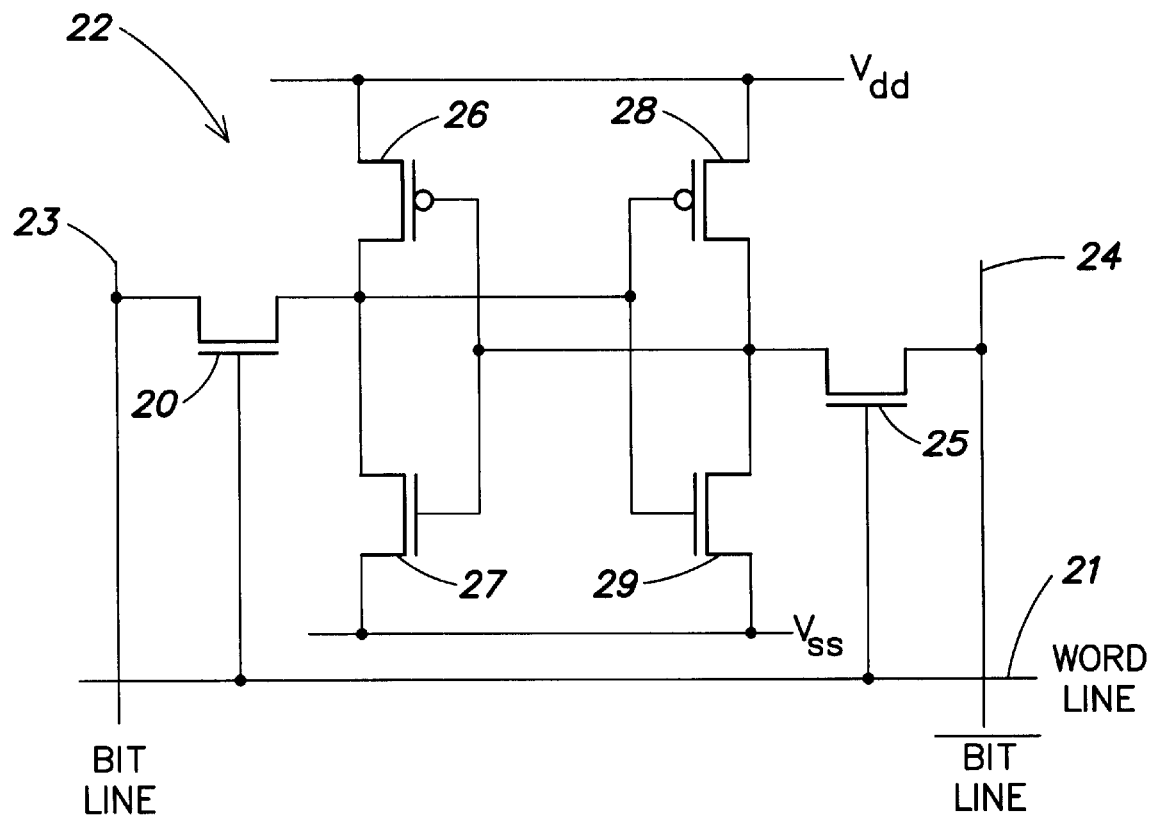
FIG. 2 shows a typical memory cell for use in the circuit of FIG. 1.

Referring now to FIG. 2, an exemplary memory cell 22 consists of two cross-coupled inverter circuits 26, 27; 28, 29. The left hand inverter as shown consists of a P channel FET 26 connected between a positive supply VDD and a first common node and an N channel FET 27 connected between the first common node and a negative supply VSS. The right hand inverter, as shown, similarly consists of a second P conductivity FET 28 connected between the positive supply VDD and a second common node, and a second N channel FET 29 connected between the second common node and the negative supply VSS. The gates of the first P and first N transistors 26, 27 are connected together and to the second common node, and the gates of the second P transistor 28 and the second N transistor 29 are connected together and to the first common node. The first common node is connected via an N type pass transistor 20 to a first bitline 23 and the second common node is connected via a second N channel pass transistor 25 to a second bitline 24. The wordline 21 forms the gate connection to both the first and second pass transistors 20 and 25. As is known to those skilled in the art the bitlines 23, 24 are complementary and form the column lines of the memory array whereas the wordlines form the row lines of the array.

In operation, information is written into the memory cell 22 by providing a differential potential on the bitlines 23, 24.

If for example bitline 23 is connected to a logic 1 and bitline 24 to a logic 0, then when the wordline 21 goes logic 1 the pass transistors 20, 25 will turn on and the cross-coupled inverters will latch into a corresponding state with the first common node at a high potential and the second common node at a low potential. To read from the memory the wordline is once again connected to a logic 1 and the pass transistors 20, 25 will then turn on causing the bitline potential to tend towards the respective potential of the common node to which it is connected.

Returning again to FIG. 1, each pair of bitlines is connected to a respective sense amplifier 40. The output of the sense amplifier 40 feeds via a buffer 41 to a corresponding number of output pads 50.

In the illustrated embodiment, 32 pairs of bitlines are provided and thus there are 32 sense amplifiers 40, connected to 32 output terminals 50 via output circuitry 43.

An input to the address register 3 is provided from a plurality of input pads 60 and the address register itself is clocked at an address register clock terminal 31. A clock input pad 70 is connected to the address register clock terminal 31 via a circuit path containing the three series elements 61, 62, 63 which figuratively illustrate the delay entailed.

Figure 3:
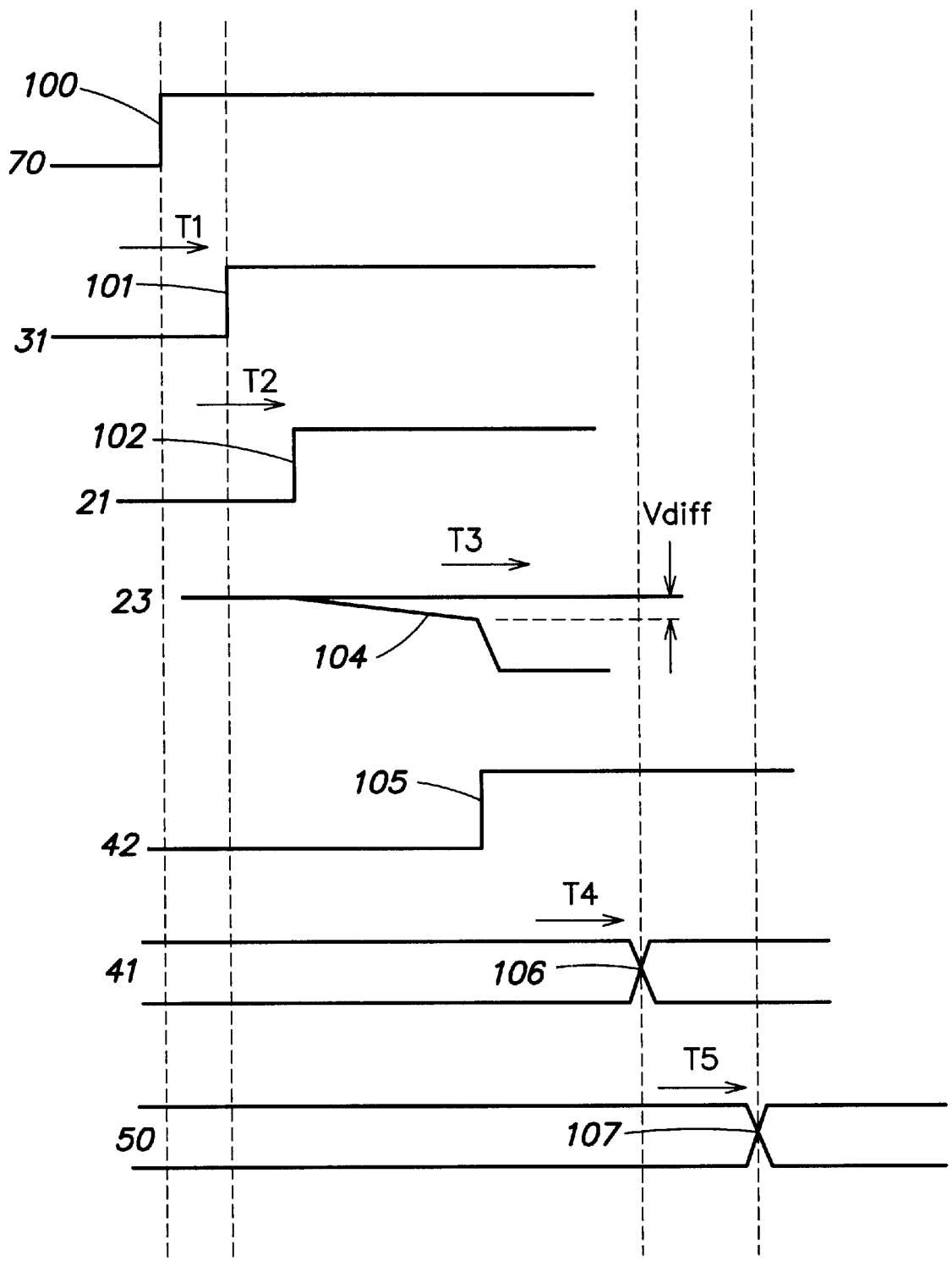
FIG. 3 shows a timing diagram of the operation of the circuit of FIG. 1.

Referring now to FIG. 3, in operation a clock pulse 100 is provided at address register clock input pad 70. After passing through the series elements 61–63 the clock pulse becomes an internal clock pulse 101 at a time T1 after the instant of application of the clock pulse 100 at the pad 70. The time period T1 is the delay induced by the path comprising series elements 61–63.

The action of the internal clock 101 on the address register 3 causes the register to apply a transition 102 to the wordlines 21 after a further time delay T2. This time delay T2 is predominantly due to the switching time of the address register 3.

As previously discussed, the transition 102 on the wordlines 21 causes the memory cells 22 to become connected to the complementary bitlines 23, 24. The bitlines 23, 24 have a relatively high capacitance and the memory cells 22 have a relatively low current driving capability which means that the change of potential of 104 is relatively slow. If the sense amplifier 40 were activated before the differential Vdiff between the complementary bitlines had achieved a sufficiently high value, the sense amplifier might latch into an incorrect state. Accordingly, a clock pulse 105 is applied to the clock terminal 42 of the sense amplifiers 40 at a time T3 where it is expected that the bitlines will have a sufficiently high differential voltage to ensure correct sensing. In turn, the sense amplifiers require a further interval T4 before the outputs at the output nodes of the buffers 41 have achieved a reliable level. Finally, the data output circuitry 43 causes a yet further delay T5 before the response to the access caused by the clock pulse 100 applied to terminal 70 is accessible at the output pads 50.

As noted above, the clock pulse 105 is applied at a time sufficiently late to ensure that the sense amplifier will correctly sense the state of the bitlines. It is desirable to apply this clock pulse earlier whilst still retaining certainty that the correct sensing will occur.

Figure 4:
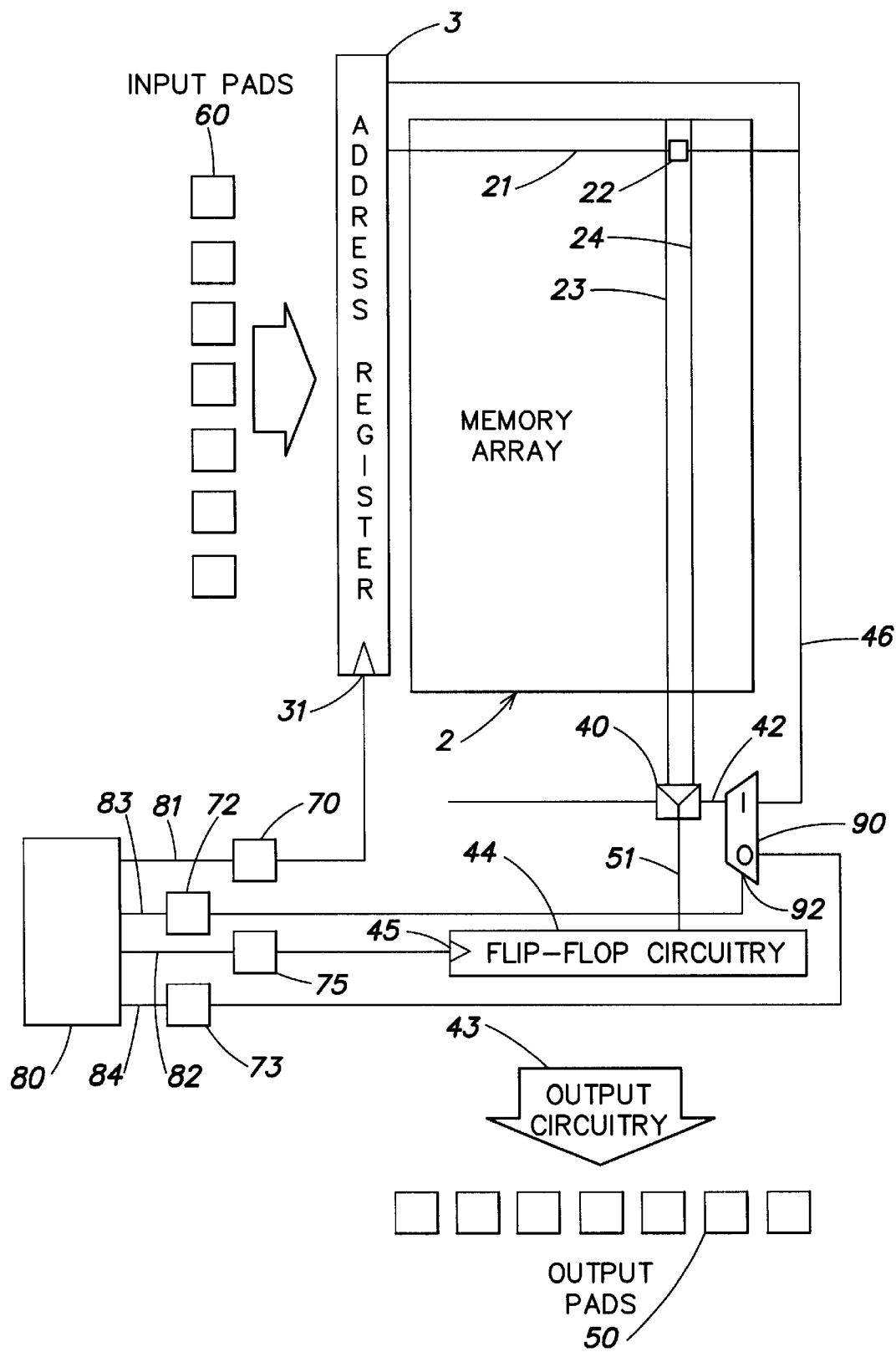
FIG. 4 shows a memory testing device incorporating the present invention.

Referring now to FIG. 4, a first embodiment of the present invention has a multiplexer 90 providing an output to the clock terminal 42 of the sense amplifier 40, the two inputs to the multiplexer 90 being provided from the clock pulse line 46 and from an input pad 73. The multiplexer 90 is controlled by a multiplexer select pad 72.

The output terminals of the sense amplifiers are connected to flip-flop circuitry 44 having a clock input 45 connected to a flip-flop circuitry clock pad 75. When a clock pulse is applied to the flip-flop circuitry 44, the circuitry stores at its outputs the states of its inputs immediately prior to the clock pulse. The flip-flop circuitry outputs, connect via the data output circuitry 43 to the output pads 50.

It will be understood by those skilled in the art that by varying the time of application of the clock pulse at flip-flop circuitry clock node 45, the timing of occurrence a successful memory access can be determined. If the clock pulse is applied to flip-flop circuitry clock node 45 before the sense amplifier outputs are valid, then the flip-flop circuitry will store at its outputs an invalid condition and this will be accessible at the output pads 50. If the pulse is applied successively later, the appearance of a valid output indicates the instant at which the access has occurred.

Figure 5:
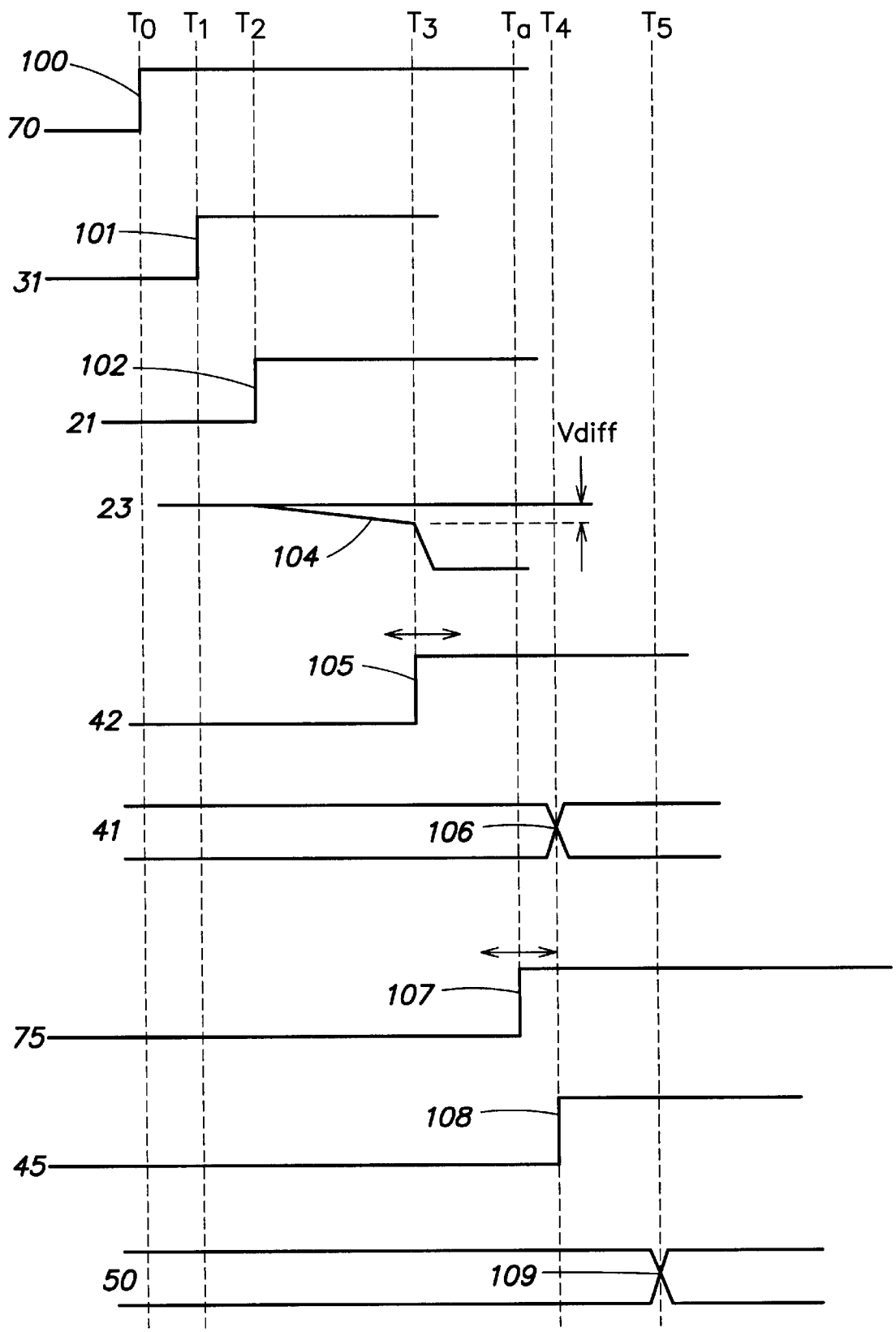
FIG. 5 shows a timing diagram of the embodiment of FIG. 4.

Operation of the circuit of FIG. 4 will now be described with reference to FIG. 5:

In an initial test phase, the multiplexer 90 is set by the multiplexer select node 72 to allow self clocking of the sense amplifiers from the clock line 46 of the memory. A timing signal 100 is applied to the address register clock input pad 70 at time T0 and this pulse will arrive at the address register clock node 31 as an internal clock pulse 101 at a time T1 determined by the delay caused by the path connecting the input pad 70 to the clock node 31.

As previously discussed, this will cause the wordline 21 to go to logic high at a rising edge 102, at a somewhat later time T2 and, allowing sufficient time for the bitlines 23, 24 to acquire a sufficiently high differential, the sense amplifiers 40 are clocked at a still later time T3 with a sense amplifier clock 105. The inherent sense amplifier delay produces an output 106 at a yet later time T4 at the flip-flop inputs.

The above described operation is performed successively while varying the instant of application of a second timing signal 107 to the flip-flop circuitry clock input pad 75. This pulse arrives at the flip-flop circuitry clock node 45 as an internal clock signal 108 after a delay Td. The timing is varied until Ta, the instant where the internal clock signal 108 is coincident with the sense amplifier output 106. This is sensed by varying the timing until the data output 109 at output pads 50 is just valid. By "just valid" it is meant that any earlier application of the second timing signal 107 to input pad 75 would give rise to invalid data.

The instant of application of the second timing signal 107 at pad 75 is then locked at Ta the just valid instant with respect to the time of application of the timing signal at address register clock pad 70 for the remainder of the test.

A control signal is the applied to the multiplexer select pad 72 so as to switch multiplexer 90 over such that external clock signals supplied from the sense amplifier clock pad 73 are provided to the sense amplifiers 40.

Then operation of the circuit is resumed using the first timing signal 100 applied to clock input pad 70 with the second timing signal 107 provided to input pad 75 locked at the valid delay after first timing signal 100, previously determined. Initially, an external sense amplifier clock input is applied at sense amplifier clock pad 73 and the time of application of this is varied until a valid output is sensed at the output pads 50.

This valid output means that the external sense amplifier at the sense amplifier clock input 42 is clocked after the differential on the bitlines has built up enough to provide a valid output.

Once such a valid output is achieved, the timing of the sense amplifier clock pulse is further delayed until it is determined that any further increase in delay would give rise to an invalid output at output pads 50 ie produces a latest just valid result. Since the flip-flop clock pulse has been maintained at its fixed timing Ta with respect to the input clock pulse applied to address register input pads 70, the "latest just valid" external sense amplifier clock occurs at the instant that the internally generated sense amplifier clock would have been applied over line 46.

Having established this instant, the delay of the externally applied sense amplifier clock is then successively reduced until again an invalid output occurs at the output pads 50 at an instant termed the earliest just valid instant. In this case, the invalidity is due to the sense amplifier 40 being clocked when an insufficient differential on the complementary bitlines 23, 24 exists.

The time differential between the two "latest just valid" and "earliest just valid" extremes of the externally applied sense amplifier clock pulse represents the amount by which the internal sense amplifier clock over line 46 could be shortened in time whilst still achieving a valid output.

Having determined this margin of timing, it may be possible to reduce the delay induced by the clock pulse delay line 46. It will be borne in mind of course that operating the sense amplifier at exactly the "earliest just valid" minimum delay is likely to be undesirable since some margin must be provided.

Those skilled in the art will appreciate that the circuit described above, and the method of use is advantageous in that it does not require absolute measurements to be made of any of the delays in the circuit. Moreover, the path links for the various externally applied clocks are not significant in the measurements, which measurements allow the operating time margin to be nonetheless accurately measured.

In a second embodiment, the path length between the first clock input pad 70 and the address register clock input 31 and the path length between the sense amplifier clock pad 73 and the sense amplifier clock input 40 are set to be the same in which case it would be possible to determine absolutely the minimum possible time delay for clocking the sense amplifiers to ensure sufficient bitline differential had developed.

What is claimed is:

1. A method of operating a device, the device comprising circuitry having an input responsive to a first timing signal and producing a valid output to clocked output circuitry after a first delay, said clocked output circuitry having a clock node, and a clock delay circuit responsive to said first timing signal for providing after a second delay, a second timing signal to said clock node of said clocked output circuitry, the method comprising:

repeatedly applying said first timing signal followed by an external timing signal, wherein said external timing signal is applied via a delay-producing first path to said clock node;

monitoring an output of said clocked output circuitry;

varying the delay produced by said delay-producing first path to vary the delay of application of said external timing signal with respect to said first timing signal; and in response to a desired output of said clocked output circuitry, modifying said second delay.

2. The method of claim 1, wherein said desired output is a just valid output such that any reduced delay in said external timing signal gives rise to an invalid output.

3. The method of claim 2 comprising, before said repeatedly applying step, determining when said second timing signal occurs and, during said repeatedly applying step, determining when said desired output occurs.

4. The method of claim 3, wherein said step of determining when said second timing signal occurs comprises:

providing latch circuitry responsive to the output of said clocked output circuitry, said latch circuitry having a latch clock node connected to a latch clock pad via a delay producing second path;

repeatedly providing said second timing signal to said clock node of said clocked output circuitry and a latch timing signal to said latch clock pad;

varying the time of occurrence of said latch timing signal; and monitoring the latch circuitry output.

5. The method of claim 4, further comprising after said step of monitoring the latch circuitry output, applying the externally generated clock signal via the delay-producing first path to said clock node and varying the time thereof;

monitoring said latch circuitry output.

6. The method of claim 1, wherein said device is a memory comprising an address register having a clock input, an array of memory cells having wordlines connected to said address register, and plural bitlines and clocked sense amplifiers for evaluating said bitlines.

7. A method of determining a minimum sense amplifier clock delay in a memory, the memory comprising address register circuitry having a clock input, an array of memory cells having wordlines coupled to said address register circuitry and bitlines connected to sense amplifier circuitry, said sense amplifier circuitry having a clock input, the memory further having output circuitry having an input coupled to the output of said sense amplifier circuitry and an output, the method comprising:

providing a first path having an input, said first path having an output coupled to said clock input of said address register circuitry;

providing a second path having an input, said second path having an output coupled to said clock input of said sense amplifier circuitry;

repeatedly applying first timing signals at said input of said first path and at a variable delay after each said application, applying a second timing signal at said input of said second path; and evaluating conditions at said output of said output circuitry.

8. The method of claim 7, wherein said output circuitry has an output circuitry clock input, said memory further comprises a sense amplifier clock generator having an output, and said method comprises, before said repeatedly applying step, the repeated steps of applying first timing signals at said first path, and applying the output of said sense amplifier clock pulse generator to said clock input of said sense amplifier circuitry whilst varying the delay of application of a timing signal with respect to said first timing signal to said clock input of said output circuitry until a desired output condition exists.

9. The method of claim 8, wherein said repeatedly applying step comprises applying said timing signal to said output circuitry clock input at the delay where said desired output condition exists.

10. A testing device for a memory, said memory having address register circuitry having an address register clock node, a memory array and sense amplifier circuitry having a sense amplifier clock node and a sense amplifier output, said testing device comprising a first timing signal generator coupled to said address register clock node via a first path for clocking said address register circuitry, a sense amplifier clock generator responsive to a signal at said address register clock node for producing a first sense amplifier clock signal, a second timing signal generator coupled to said sense amplifier clock node for providing a second sense amplifier clock signal, clocking and selector circuitry for selectably coupling said first or said second sense amplifier clock signal, to said sense amplifier clock node, said device further comprising means for varying the timing of said second sense amplifier clock signal with respect to said first timing signal.

11. The testing device of claim 10, further comprising output circuitry connected between said sense amplifier output and a device output, and evaluating apparatus coupled to said device output.

12. The device of claim 10, wherein said output circuitry comprises clocked latch circuitry connected at said sense amplifier output, and having a clock node coupled to receive a third timing signal.

13. The device of claim 11 wherein said output circuitry comprises clocked latch circuitry connected at said sense amplifier output, and having a clock node coupled to receive a third timing signal.

* * * * *